(12) United States Patent
Hurwitz

(10) Patent No.: US 12,445,104 B2
(45) Date of Patent: Oct. 14, 2025

(54) FBAR FILTER WITH TRAP RICH LAYER

(71) Applicant: Zhuhai Crystal Resonance Technologies Co., Ltd., Tianjin (CN)

(72) Inventor: Dror Hurwitz, Zhuhai (CN)

(73) Assignee: ZHUHAI CRYSTAL RESONANCE TECHNOLOGIES CO., LTD., Tianjin (CN)

( * ) Notice: Subject to any disclaimer, the term of this patent is extended or adjusted under 35 U.S.C. 154(b) by 1015 days.

(21) Appl. No.: 17/518,742

(22) Filed: Nov. 4, 2021

(65) Prior Publication Data

US 2023/0132706 A1     May 4, 2023

(51) Int. Cl.
| | |
|---|---|
| H03H 9/02 | (2006.01) |
| H03H 3/02 | (2006.01) |
| H03H 9/10 | (2006.01) |
| H03H 9/13 | (2006.01) |
| H03H 9/17 | (2006.01) |

(52) U.S. Cl.
CPC .......... H03H 9/02149 (2013.01); H03H 3/02 (2013.01); H03H 9/105 (2013.01); H03H 9/13 (2013.01); H03H 9/174 (2013.01); *H03H 2003/023* (2013.01)

(58) Field of Classification Search
CPC ...... H03H 9/02149; H03H 9/105; H03H 9/13; H03H 9/174; H03H 9/02125; H03H 9/173; H03H 9/02015; H03H 9/1007; H03H 9/564; H03H 9/582; H03H 3/02; H03H 2003/023; H03H 2003/021
See application file for complete search history.

(56) References Cited

U.S. PATENT DOCUMENTS

| | | | | |
|---|---|---|---|---|
| 7,728,485 | B2 * | 6/2010 | Handtmann | H03H 9/175 216/2 |
| 10,541,667 | B2 * | 1/2020 | Gilbert | H03H 9/02866 |
| 2015/0270279 | A1 * | 9/2015 | Arigane | H10D 64/017 438/283 |

* cited by examiner

*Primary Examiner* — Emily P Pham
(74) *Attorney, Agent, or Firm* — Wiggin and Dana LLP

(57) ABSTRACT

An acoustic resonator forms a component of an FBAR filter that includes a trap-rich layer to avoid parasitic conduction by degrading carrier lifetimes of a free charge carriers. The acoustic resonator has a first electrode, a second electrode disposed parallel to the first planar portion and a piezoelectric layer disposed between and contacting both the first and second planar electrodes. A silicon-based a support layer is bonded to the second electrode and includes a trap region. The acoustic resonator may be manufactured by (a) depositing the trap region on the support layer; (b) oxidizing a surface of the trap region; (c) depositing a bonding layer on the oxidized surface of the trap region; (d) bonding a first electrode to the bonding layer; (e) contacting a first side of a piezoelectric layer to the electrode; and (f) contacting a second side of the piezoelectric layer a second electrode.

7 Claims, 8 Drawing Sheets

FBAR FILTER WITH TRAP RICH LAYER

BACKGROUND

Wireless communication devices, such as cellular telephones, usually include radio frequency (RF) filters to improve both the reception and the transmission of signals. RF filters pass desired frequencies and reject unwanted frequencies enabling band selection and allowing the cellular telephone to process only intended signals. One preferred filter system utilizes resonators based on the piezoelectric effect because these filter systems facilitate overall system miniaturization. In piezoelectric-based resonators, acoustic resonant modes are generated in a piezoelectric material. The acoustic waves are converted into electrical signals for use in electrical applications.

Two common types of acoustic resonators are Surface Acoustic Wave Resonators (SAW) and Bulk Acoustic Wave Resonators (BAW). In Surface Acoustic Wave Resonators, an acoustic signal is carried by a surface wave. In Bulk Acoustic Wave Resonators, the acoustic signal is carried through the bulk of the resonator film. One type of BAW is a Film Bulk Acoustic Resonator (FBAR). The FBAR includes an acoustic stack having a layer of piezoelectric material disposed between two electrodes. Acoustic waves achieve resonance across the acoustic stack with the resonant frequency of the waves determined by materials making up the stack and the configuration of those materials. FBARs typically resonate in gigahertz (GHz) frequencies.

An FBAR and a method for manufacture is presented in U.S. Pat. No. 10,389,331 B2, titled "Single Crystal Piezoelectric RF Resonators and Filters," by the Applicant of the present patent application, Dror Hurwitz. U.S. Pat. No. 10,389,331 B2 is incorporated by reference herein in its entirety.

Silicon is a most common material in the semiconductor industry. The infrastructure for silicon-based semiconductor fabrication plants is well established. The coefficient of thermal expansion stress characteristics of silicon are well suited for it to be a basic substrate for an FBAR. Silicon wafers with diameters of 6 inches, 8 inches and 12 inches are readily available at a low cost. The ease of MEMS (Micro-Electromechanical Systems) assembly operations (such as TSV (through silicon vias) for membrane release) further support silicon as a basic substrate for FBAR filters. Today, the vast majority of FBAR is built on silicon. Although FBAR can be made on other isolating materials, none of the alternatives have the advantages silicon does. For all these reasons, it makes sense to use Si. However, silicon is electrically conductive. Even when using high resistivity silicon (HR-Si), the conductivity causes a degrading of FBAR performance.

Using $SiO_2$ for membrane release purposes, presents an opportunity to generate a complete isolating substrate. The isolating layer is built on a high resistivity silicon substrate. However, oxidized HR-Si substrates suffers from parasitic surface conduction due to fixed oxide charges which attract free carriers near the $Si/SiO_2$ interface.

The problem of parasitic surface conduction occurs when high resistivity silicon used as the substrate layer forms an inversion or accumulation region because charge carriers are affected by the signal voltage in the active structure. The degree to which charge carriers in the inversion or accumulation region are displaced is directly influenced by signals in the active structure. As a result, the capacitance of the junction between the substrate layer and the active structure depends on the electric field emanating from the active structure. This capacitance results in nonlinearity and added insertion losses of the FBAR filter and a concomitant loss of signal purity. In addition, an electric field can invert this interface on the side of the substrate layer and create a channel-like layer within the inversion or accumulation region where charges can move in a lateral direction despite the substrate layer being highly resistive. This effect can lead to signal-degrading cross talk in RF communication circuits and the Q (quality) factor of the FBAR filter will be degraded.

SUMMARY OF THE DISCLOSURE

Disclosed herein is an acoustic resonator as a component of an FBAR filter. The acoustic resonator has a first electrode having a first planar portion, a second electrode having a second planar portion disposed parallel to the first planar portion and a piezoelectric layer disposed between and contacting both the first planar portion and the second planar portion. There is a silicon-based support layer bonded to the second electrode. This support layer has a trap region that degrades a carrier lifetime of a free charge carrier.

The acoustic resonator may be manufactured by (a) depositing a trap region on a substrate where the trap region is effective to degrade a carrier lifetime of a free charge carrier; (b) oxidizing a surface of the trap region; (c) depositing a bonding layer on the oxidized surface of the trap region; (d) bonding a first electrode having a first planar portion to the bonding layer; (e) contacting a first side of a piezoelectric layer to the first planar portion; and (f) contacting a second side of the piezoelectric layer to a first planar portion of a second electrode.

DETAILED DESCRIPTION

Figure 1:
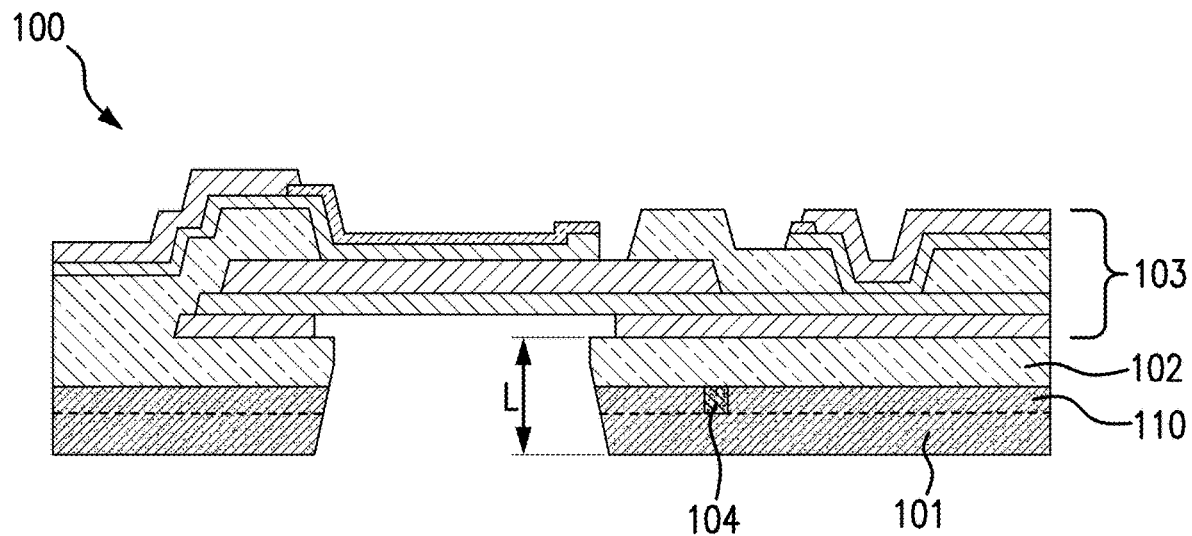
FIG. 1 illustrates an FBAR filter with parasitic surface conduction as known from the prior art.

FIG. 1 illustrates an FBAR filter 100 known from the prior art. This prior art FBAR filter 100 is at risk for parasitic surface conduction. In this FBAR filter 100, a high resistivity silicon forms a substrate layer 101. An inversion or accumulation region 110 develops because charge carriers are affected by the signal voltage in an active resonator structure 103. An inversion region is a conducting channel 104 that connects two n-type regions at a source and a drain allowing a free flow of electron charges. An accumulation region blocks the flow of electron charges through the conducting channel such that they accumulate on a surface adjacent the channel 104. The degree to which charge carriers in the region 110 are displaced is directly altered by signals in the active structure 103. As a result, the capacitance of an $SiO_2$ buried oxide (BOX) layer 102 between the substrate layer 101 and the active resonator structure 103 depends on the electric field emanating from the active resonator structure 103.

This capacitance results in nonlinearity and added insertion losses of the FBAR filter 100 and a concomitant loss of signal purity. In addition, an electric field can invert this interface on the side of the substrate layer 101 creating the conducting channel 104 within the region 110 where charges can move easily in a lateral direction, L, despite the substrate layer 101 being highly resistive. This effect can then lead to signal-degrading cross talk in RF communication circuits and the Q factor of the FBAR filter 100 will be degraded.

Figure 2:
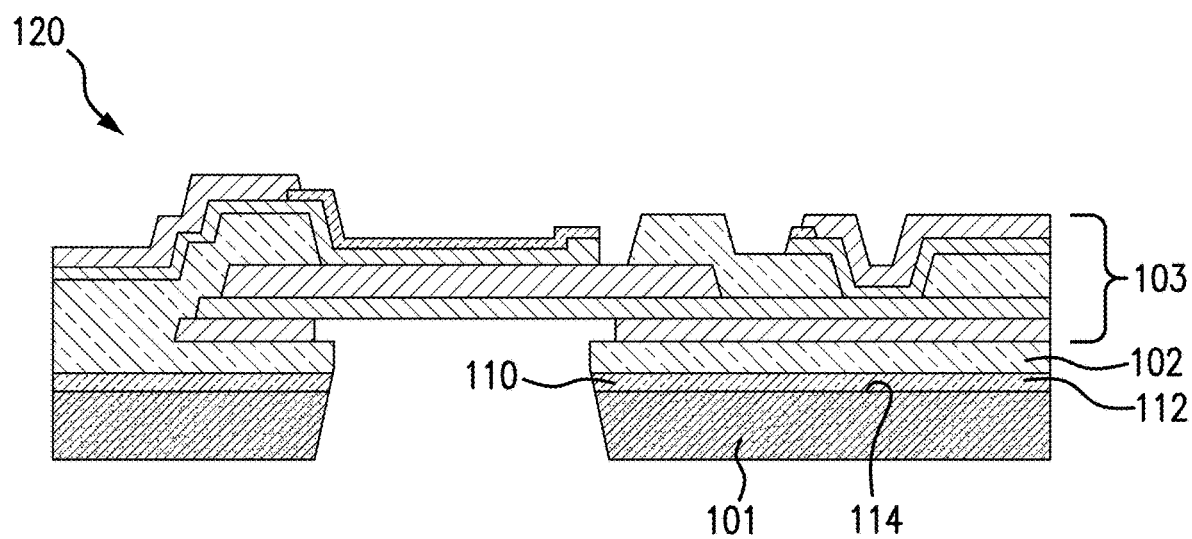
FIG. 2 illustrates an FBAR filter with a trap-rich layer to avoid parasitic surface conduction.

FIG. 2 illustrates an FBAR filter 120 with a trap-rich layer to avoid parasitic surface conduction. A high resistivity silicon substrate has a resistivity in excess of 3000 ohm*cm. To prevent the charging side effect between the high resistivity silicon substrate 101 and the $SiO_2$ buried oxide (BOX) layer 102, a trap-rich layer 112, such as amorphous silicon (a-Si) or polycrystal silicon (poly-Si), is formed within the region 110. This trap-rich layer 112 has a thickness of between 500 nanometers (nm) and 800 nm. The trap-rich layer 112 freezes the access of charge carriers attracted at the Si surface 114. The parasitic surface conduction is effectively combated because the trap-rich layer significantly degrades the carrier lifetimes of free charge carriers in the region 110. Since the charge carriers cannot travel far before being trapped, the effective resistivity of the substrate 101 is preserved and the capacitance is not as dependent upon the signals in the active resonator structure 103. Thus, the Quality Factor (Q) of FBAR filter 120 is improved.

Figure 3:
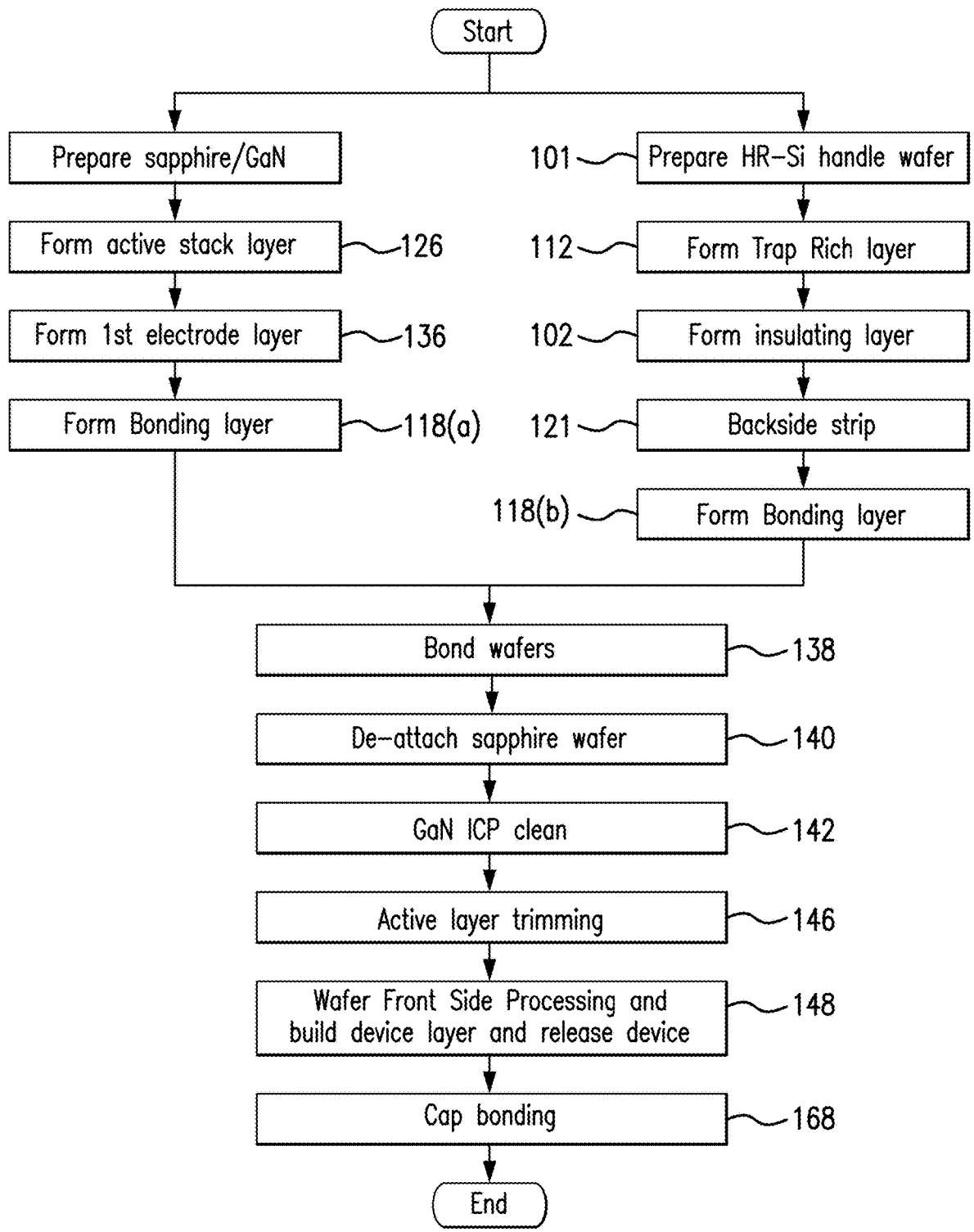
FIG. 3 is a flow chart representation of the process steps to manufacture an FBAR filter with a trap-rich layer.
Figure 4:
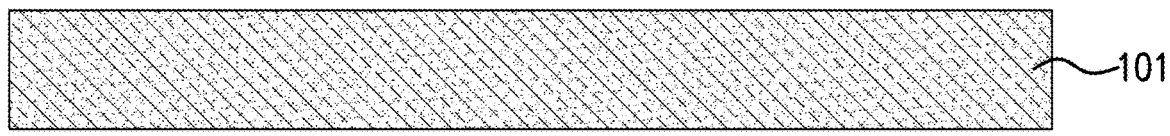
FIG. 4 is a cross-sectional representation of a high resistivity silicon substrate, also referred to as a handle wafer.

FIG. 3 is a flow chart representation of one embodiment of process steps to manufacture an FBAR filter with a trap-rich layer. As shown in FIG. 4, a first process step is preparation of the high resistivity silicon substrate 101, also referred to as a handle wafer. The substrate is a silicon wafer with an exemplary diameter of 150 millimeters+/−0.2 mm and a thickness of 1000 micrometers+/−15 µm. The silicon may be doped to be either P or N type with a crystal orientation of <1-0-0>+/−0.05°. The direction along with orientation is <1-1-0>. Other exemplary properties are a resistivity in excess of 5000 ohm-centimeter, a total thickness variation of less than 5 µm, a warp of less than 50 µm and a bow of less than 50 µm.

Figure 5:
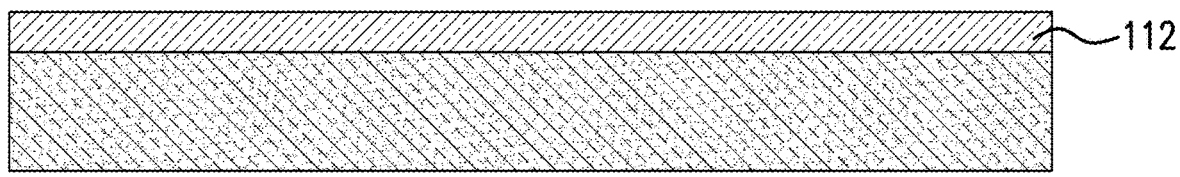
FIG. 5 is a cross-sectional representation of a trap-rich layer deposited on the handle wafer.

Referencing FIGS. 3 and 5, a trap-rich layer 112 is deposited on the handle wafer 101. The trap-rich layer 112 may be amorphous silicon or polycrystalline silicon deposited by a process such as low pressure chemical vapor deposition (LPCVD) such that the compressive stress of the deposited layer is between −200 megapascal and −400 MPa. An exemplary thickness for the trap-rich layer is 650 nanometers +/−50 nm.

Figure 6:
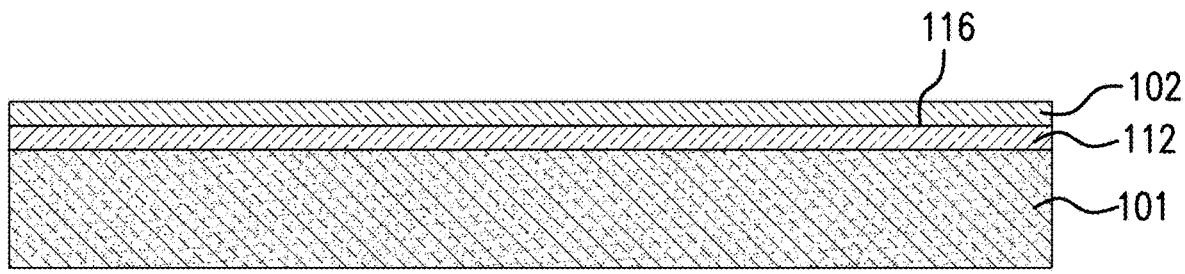
FIG. 6 is a cross sectional representation illustrating a buried oxide layer formed in a surface of the trap-rich layer.
Figure 16:
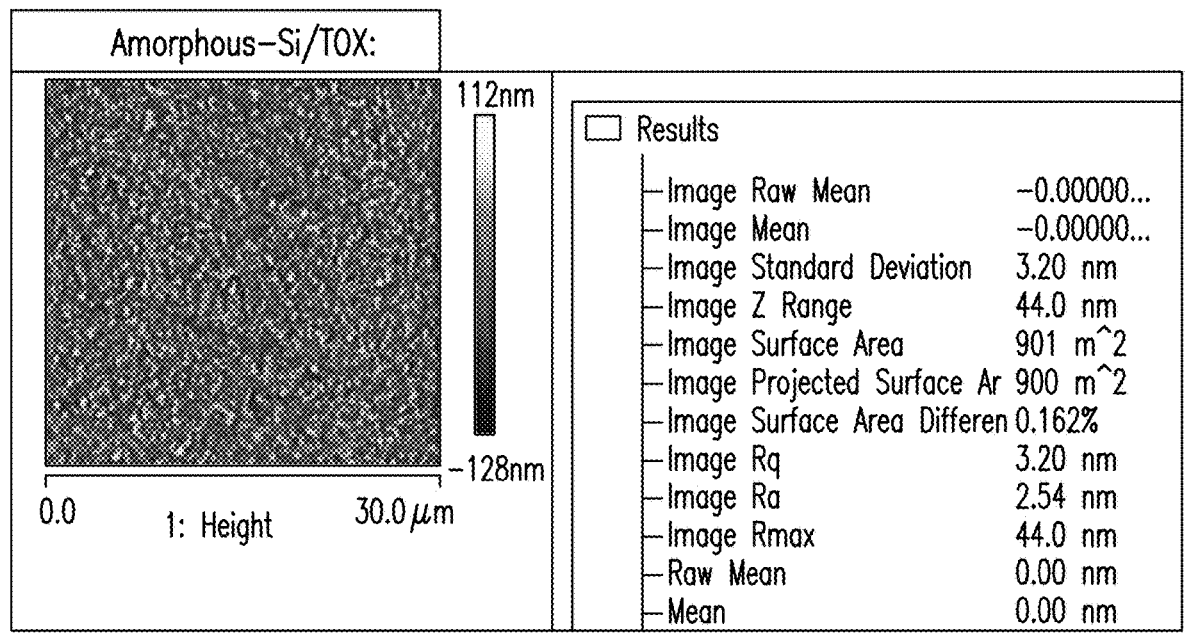
FIG. 16 is a photomicrograph showing the surface roughness of the buried oxide layer when the trap-rich layer is amorphous silicon.
Figure 17:
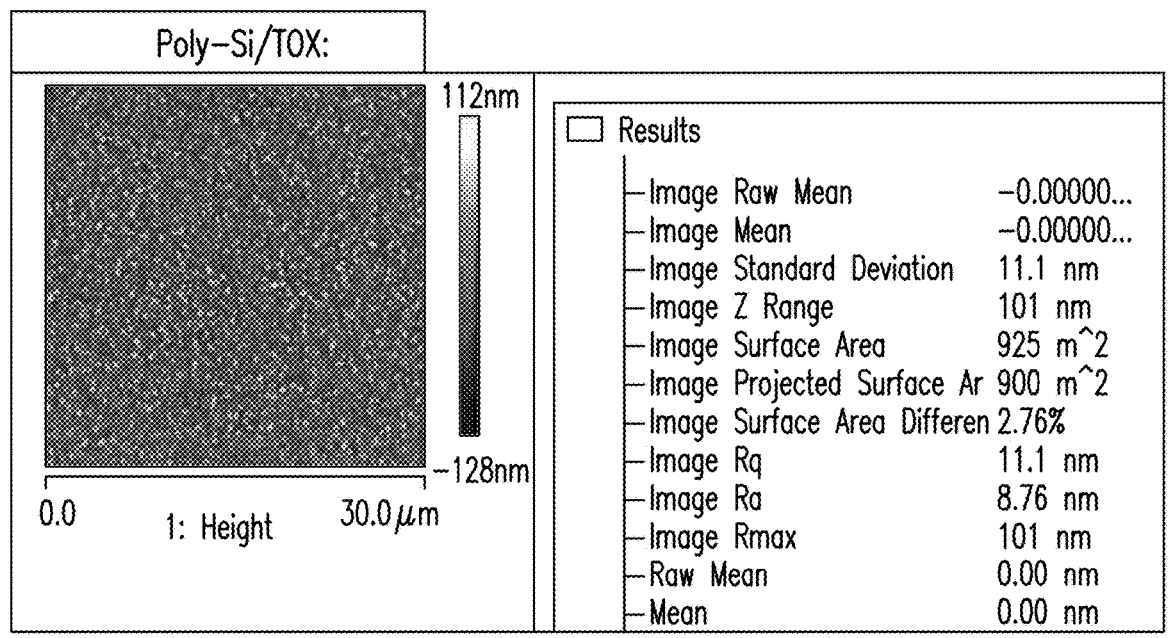
FIG. 17 is a photomicrograph showing the surface roughness of the buried oxide layer when the trap-rich layer is polycrystalline silicon.

Referencing FIGS. 3 and 6, the buried oxide $SiO_2$ layer 102 is formed in a surface 116 of the trap-rich layer 112. The oxide is formed to a thickness of 400 nanometers+/−40 nanometers such that the unoxidized portion of the trap-rich layer is 330 nm+/−30 nm. As the photomicrographs at FIGS. 16 and 17 illustrate, the surface roughness of the oxide (Ra) when the trap-rich layer is amorphous silicon is less than 2.8 nm as measured by atomic force measurement of a surface area of 10 µm by 10 µm. The surface roughness of the oxide (Ra) when the trap-rich layer is polycrystalline silicon is less than 9.0 nm as measured by atomic force measurement of a surface area of 10 µm by 10 µm. Both photomicrographs are at a magnification of 20,000 times.

Figure 7:
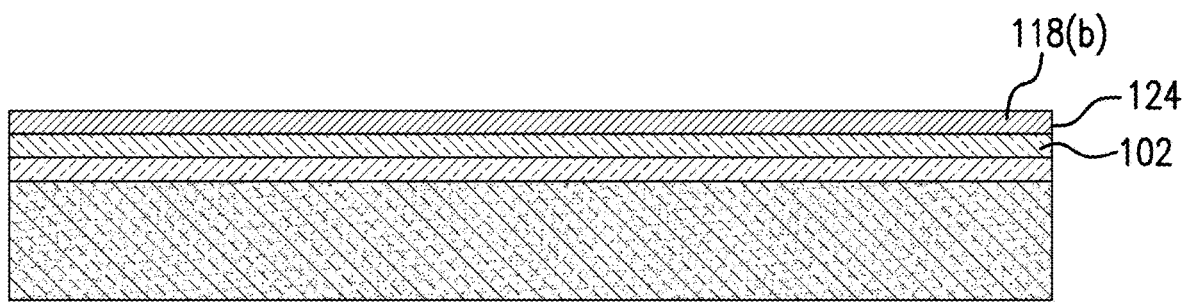
FIG. 7 is a cross sectional representation illustrating a gold bonding layer formed on a surface of the buried oxide layer.

Referencing FIGS. 3 and 7, a gold bonding layer 118(b) is formed on a surface 124 of the buried oxide $SiO_2$ layer 102. Typically, the gold bonding layer has a thickness of between 50 nanometers (nm) and 500 nm and is deposited by a physical vapor deposition (PVD) process such as e-beam evaporation or sputtering. To enhance adhesion of the gold bonding layer 118(b), a thin adhesion layer, such as titanium for example, with a nominal thickness ranging from 10 nm to 50 nm may be deposited on the surface 124 prior to deposition of the gold bonding layer 118(b).

Referring back to FIG. 3, in parallel with the silicon handle assembly, an active stack 126 is formed. The active stack 126 includes a sapphire layer wafer with a gallium nitride layer deposited on the wafer. A piezoelectric layer, such as aluminum nitride or scandium doped aluminum nitride, is deposited on the GaN layer. To provide electrical conductivity to the piezoelectric layer and to enhance bonding to the silicon handle assembly, an electrically conductive layer is formed 136 on the piezoelectric layer.

A gold bonding layer 118(a) is formed on a surface of the electrically conductive layer 136. Typically, the gold bonding layer has a thickness of between 50 nm and 500 nm and is deposited by a PVD process such as e-beam evaporation or sputtering. To enhance adhesion of the gold bonding layer 118(a), a thin adhesion layer, such as a titanium layer, with a nominal thickness ranging from 10 nm to 50 nm may be deposited on the surface of electrically conductive layer 136 prior to deposition of the gold bonding layer 118(a). The gold bonding layer 118(a) on the wafer stack 126 on sapphire support substrate 130 is then bonded to the gold layer 118(b) of the wafer handle stack 128.

Figure 8:
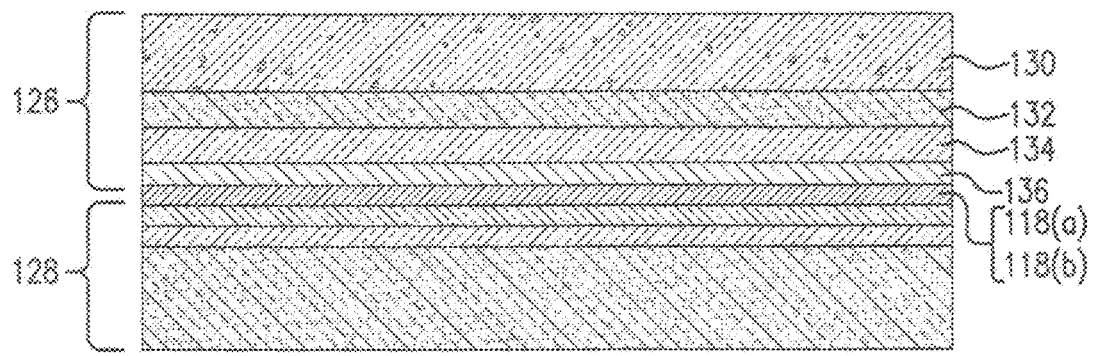
FIG. 8 illustrates in cross sectional representation an active stack bonded to the handle wafer.

FIG. 8 illustrates in cross sectional representation the active stack 126 bonded to a handle wafer assembly 128. Sapphire support layer 130 supports GaN layer 132 that supports a piezoelectric layer 134. Typically, the piezoelectric layer is formed from single crystal aluminum nitride or single crystal scandium doped aluminum nitride having an exemplary thickness of from 200 nm to 1,000 nm. An electrically conductive layer 136, typically molybdenum, is bonded to the piezoelectric layer 134. The electrically conductive layer 136 may be formed from other metals, such as tungsten or ruthenium. Alloys that are predominantly (by weight) one of molybdenum, tungsten and ruthenium may also be utilized.

Figure 9:
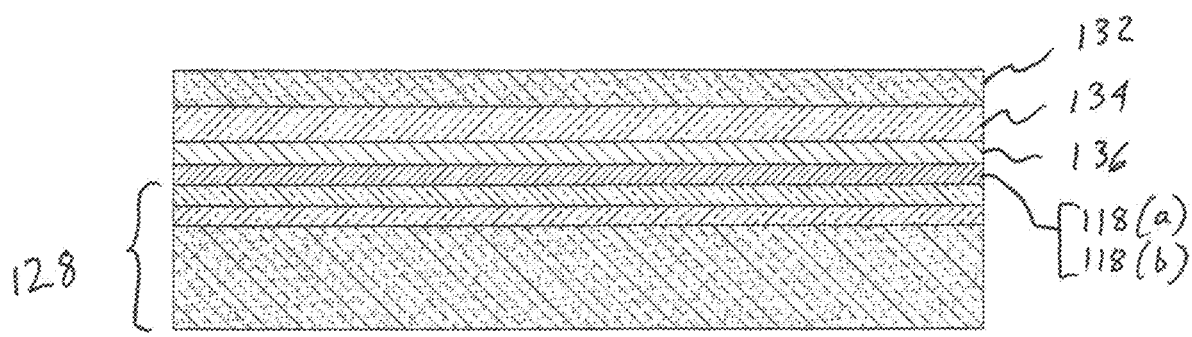
FIG. 9 shows the FBAR filter during an interim assembly step where a sapphire support layer has been removed.

Referring back to FIG. 3, after the active stack 126 is bonded to the wafer handle assembly 128, the sapphire support layer 130 is removed as described in flow step 140. De-attaching of the sapphire support layer is by a process such as laser lift-off or grinding and resulting in the structure shown in FIG. 9.

Figure 10:
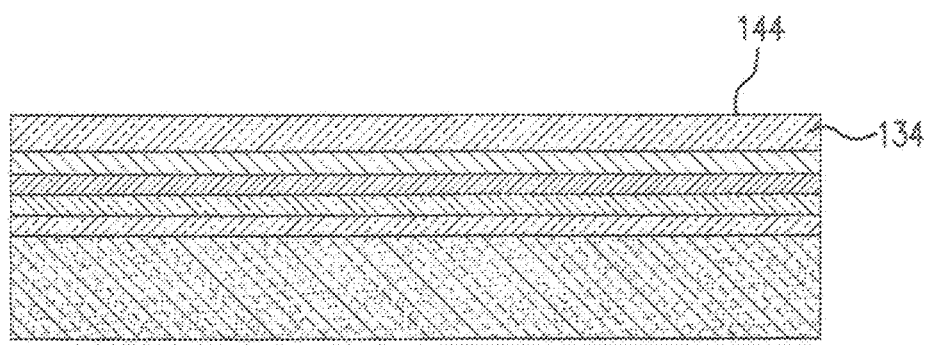
FIG. 10 illustrates the interim assembly step following removal of a gallium nitride layer.
Figure 11:
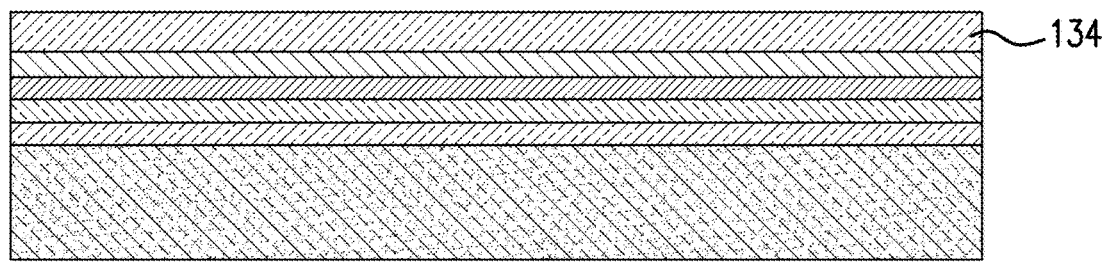
FIG. 11 illustrates trimming a piezoelectric layer to achieve desired filter properties.

Referencing FIGS. 3 and 10, the gallium nitride layer is removed as in flow step 142, such as by inductively coupled plasma (ICP) presenting a clean surface 144 of piezoelectric layer 134. Referencing FIGS. 3 and 11, the piezoelectric layer 134 is then trimmed to a length, width and thickness that provides desired filter properties. Generally, the tolerance in each dimension is on the order of +/−3 nm.

Figure 12:
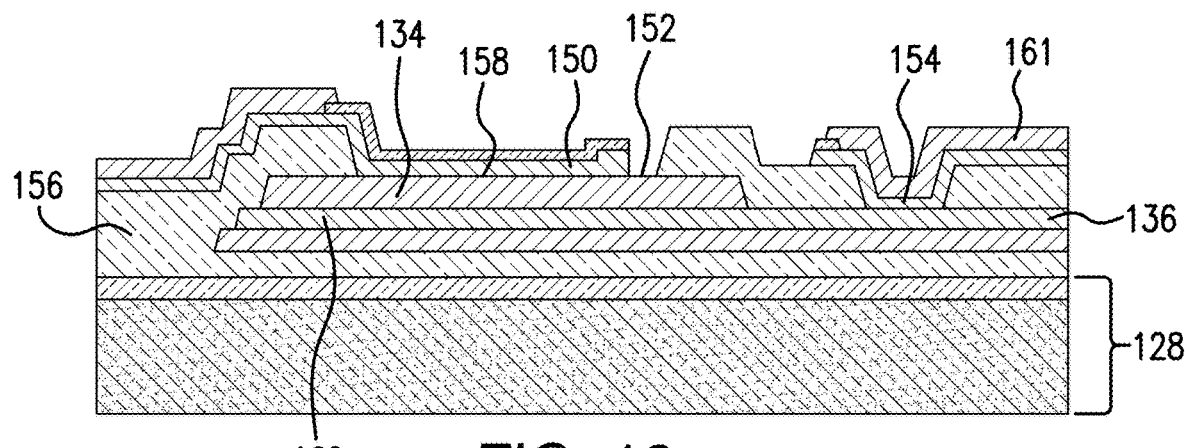
FIG. 12 illustrates back end of the line (BEOL) processing to provide electrical interconnection to the piezoelectric layer.

FIGS. 3 and 12-14 illustrate BEOL processing 148. FIG. 12 illustrate BEOL processing to provide electrical interconnection to the trimmed piezoelectric layer 134. A passivation layer 156, is deposited on select portions of the top surface of the wafer handle stack 128 and sides and select portions of the top of the piezoelectric layer 134 in preparation for deposition of second electrode material 150. The passivation layer is 156 is preferably an $SiO_2$ layer selectively deposited over most surfaces except a central portion 158 of the piezoelectric layer 134. To minimize damage to surfaces of the piezoelectric layer 134, the $SiO_2$ layer 156 is applied by a low temperature plasma deposition process to an exemplary thickness of 2.5 micrometers+/−0.1 micrometer. The stress applied to the surface is preferably less than 50 MPa (Megapascals). Utilizing low temperature plasma deposition also eliminates photoresist/polymer residue contamination of the surfaces.

The second electrode material 150 is typically molybdenum, although other metals such as tungsten or ruthenium may also be utilized. Alloys that are predominantly (by weight) one of molybdenum, tungsten and ruthenium may also be utilized. An exemplary thickness for the second electrode material is 200 nm. The second electrode material is deposited by a process such as low temperature (150° C.) sputtering or other PVD process for a high quality deposit characterized by a high density, low stress (less than 100 MPa) and a sheet resistance of Rs=below 0.5+/−0.05 ohm/square.

A portion of the passivation layer 156 is etched so that a portion of the first electrode material 136 is exposed enabling contact with the second electrode material 150 in a contact region 154 that is electrically isolated from the top surface 152 of the piezoelectric layer 134, thereby providing electrical interconnection to a bottom surface 160 of the piezoelectric layer. A gold bonding layer 161 will provide electrical interconnection to external devices.

Figure 13:
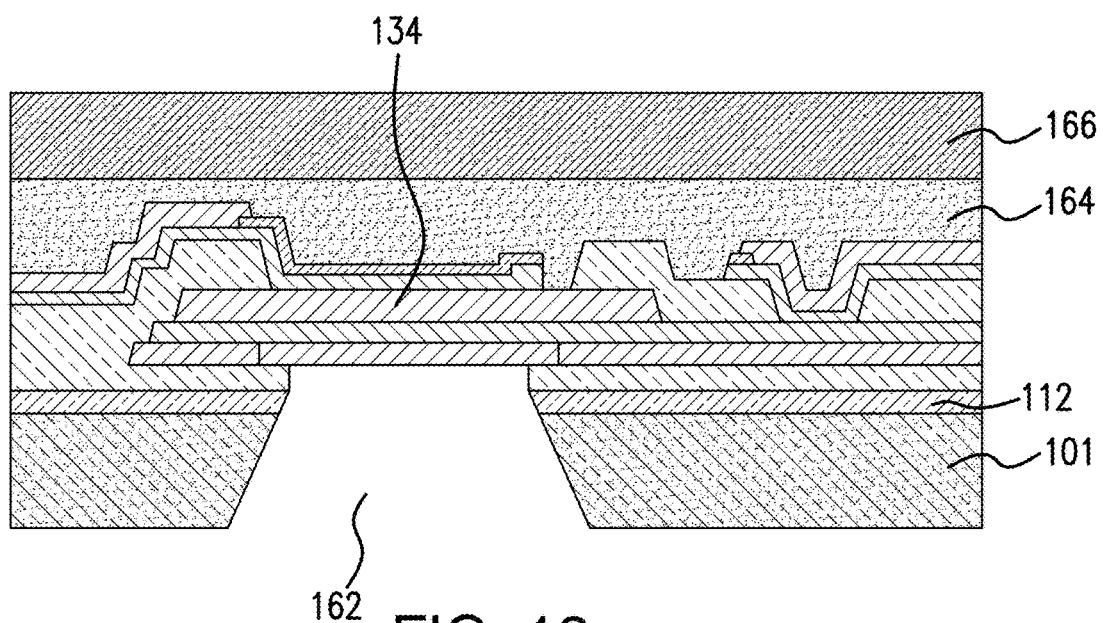
FIG. 13 illustrates BEOL processing to provide an acoustic gap below the piezoelectric layer.

FIG. 13 illustrates back end of the line processing to provide an acoustic gap 162 below the piezoelectric layer 134. A top surface sacrificial layer 164 is typically regular quality, not piezoelectric, aluminum nitride and deposited to a thickness of 100 nm+/−10 nm. A temporary silicon handle 166 is bonded to the top surface sacrificial layer 164 and provides rigidity. This rigidity enables a deep silicon etch (DSE) of about 4000 angstroms through the high resistance silicon substrate 101 and the trap-rich layer 112.

Figure 14:
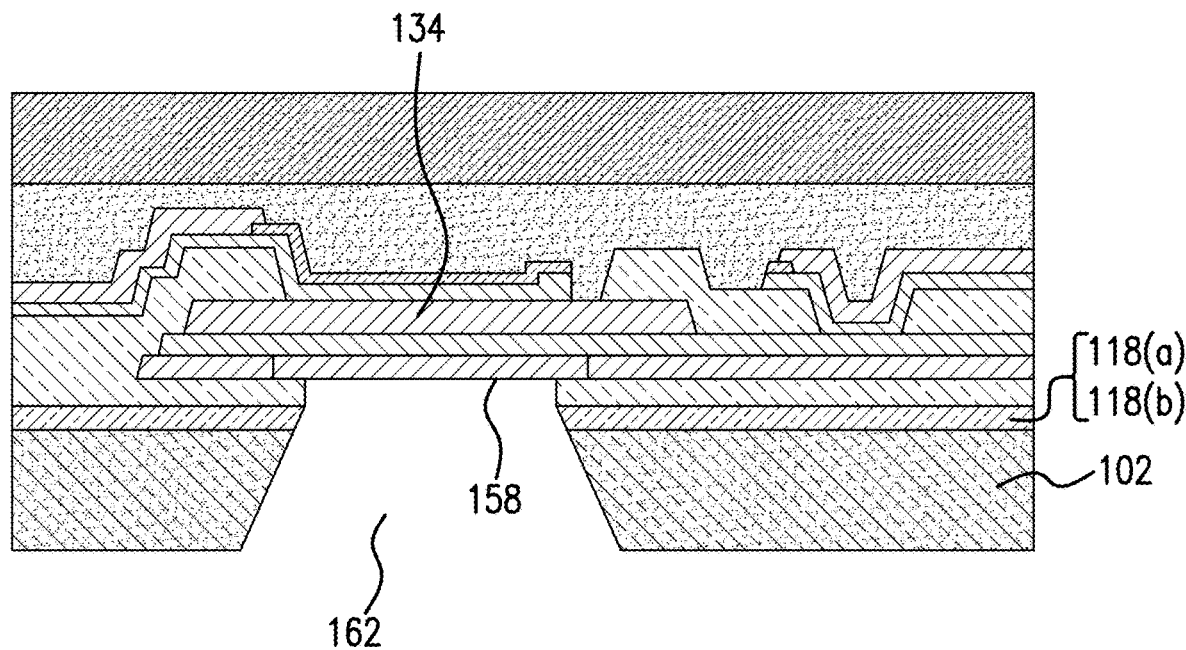
FIG. 14 illustrates further BEOL processing to remove remaining passivation layer and gold bonding layer from the acoustic gap.

FIG. 14 illustrates further BEOL processing that remove remaining passivation layer 102 and gold bonding layer 118(b) from the acoustic gap 162. A chemical etch, such as diluted hydrofluoric acid (HF), removes remaining passivation layer 102 while a solution such as KI/I2 removes the gold bonding layer 118(a) from beneath the central portion 158.

Figure 15:
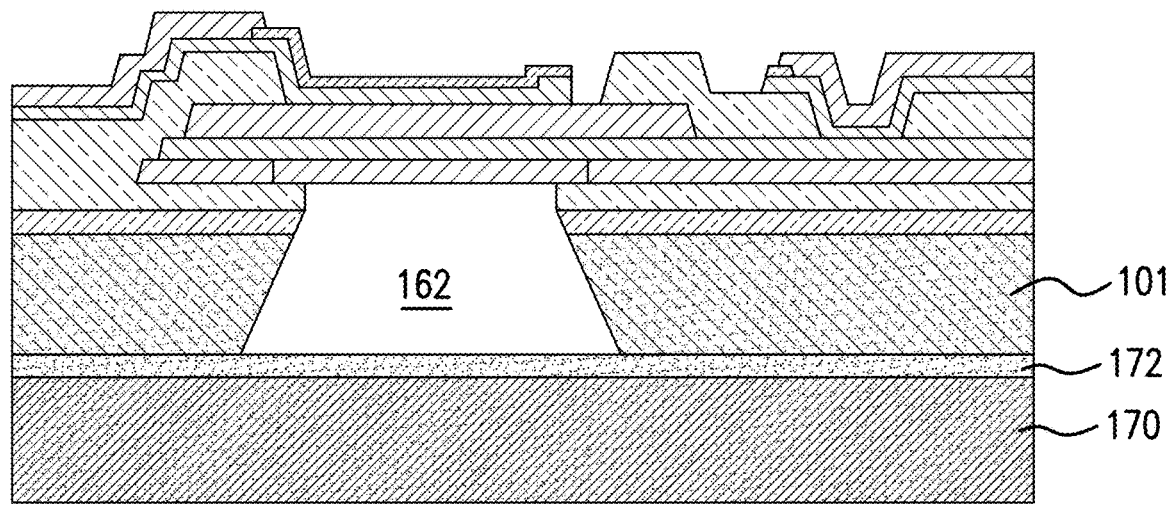
FIG. 15 illustrates cap bonding to seal the acoustic gap.

Referencing FIGS. 3 and 15, cap bonding 168 process seals the acoustic gap 162. A silicon cap 170 is bonded to the silicon handle such as with an organic adhesive 172. The rigidity provided by the silicon cap 170 enable removal of the top surface sacrificial layer and temporary silicon handle (reference numerals 164, 166 in FIG. 13).

The acoustic resonator is typically packaged to provide electrical interconnection to external devices or circuit boards and to provide environmental protection. One suitable package is formed from polymer resin as described in United States Patent Application Publication No. US 2021/0028766 A1, titled "Packages with Organic Back Ends for Electronic Components," by Hurwitz et al. The disclosure of US 2021/0028766 A1 is incorporated by reference herein in its entirety.

Figure 18:
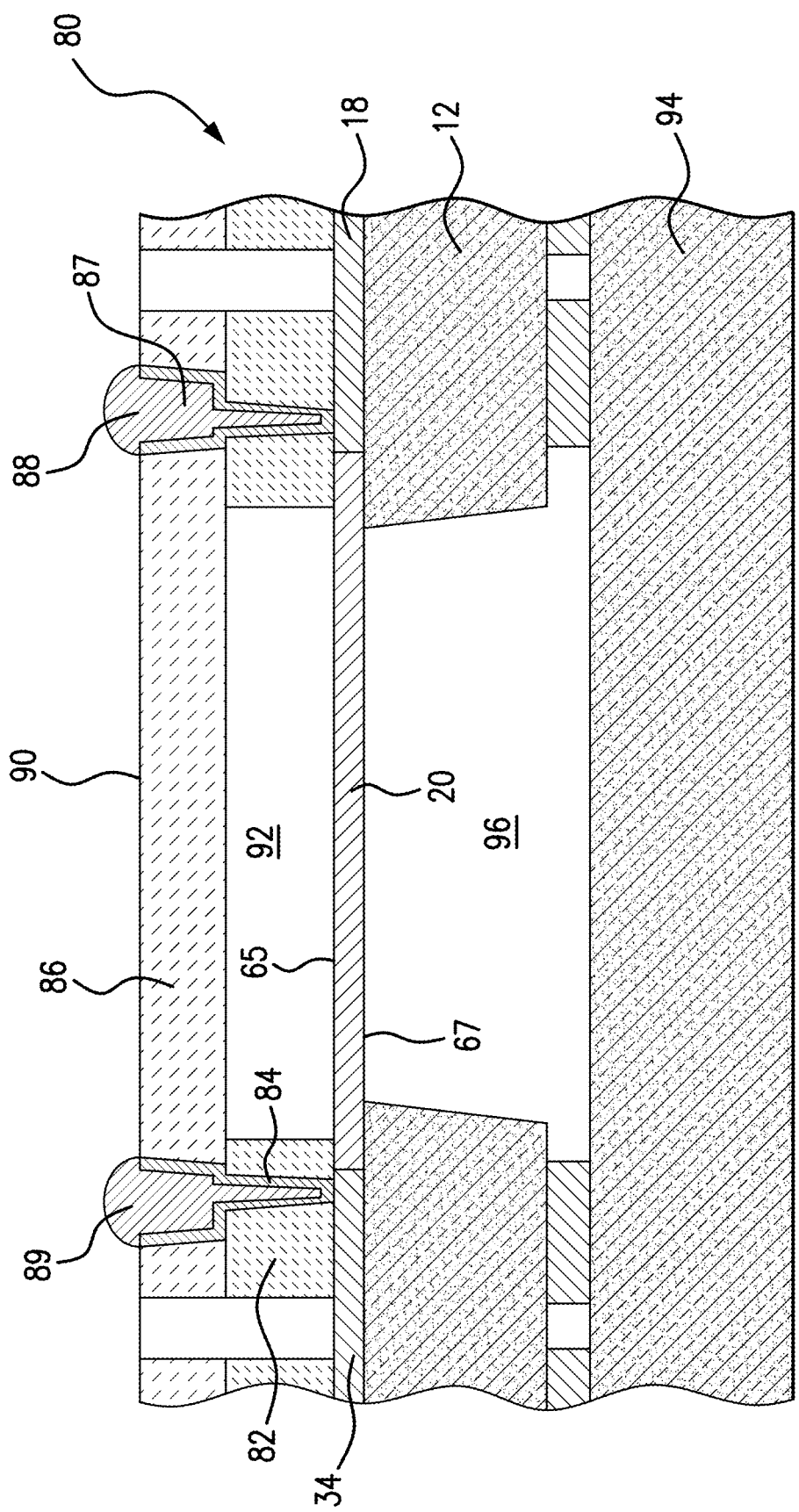
FIG. 18 illustrates an organic based wafer level package encapsulating the FBAR filter.

FIG. 18 illustrates an organic based wafer level package 80 encapsulating a piezoelectric layer 20 that maybe a component of an FBAR filter. An organic wall 82, formed from a polymer such as a photosensitive material for permanent structure formation, contains vias coated with an under bump metallization 84 (UBM) formed from an electrically conductive material such as nickel or copper. The UBM 84 provides an electrical interconnection to the first and second electrode layers of the FBAR filter. An organic roof layer 86 has an expanded via coated with a continuation of the UBM 84. Solder bump 88, such as a tin/silver alloy, fills the remainder of the via and extends beyond a surface 90 of the organic roof layer 86 for attachment and electrical interconnection to a device or a circuit board.

The invention claimed is:

1. An acoustic resonator, comprising:
    a first electrode having a first planar portion;
    a second electrode having a second planar portion disposed parallel to the first planar portion;
    a piezoelectric layer disposed between and contacting both the first planar portion and the second planar portion;
    a support layer bonded to the second electrode, the support layer having a trap-rich layer that degrades a carrier lifetimes of a free charge carrier; and
    a silicon dioxide insulating layer interposed between the trap-rich layer and both the first electrode and the second electrode.

2. The acoustic resonator of claim 1 wherein the trap-rich layer is selected from the group consisting of amorphous silicon and polycrystalline silicon.

3. The acoustic resonator of claim 2 wherein the trap-rich layer has a thickness of from 500 nanometers (nm) and 800 nm.

4. An organic based wafer level package that includes an acoustic resonator, comprising:
    the acoustic resonator having:
    a first electrode having a first planar portion;
    a second electrode having a second planar portion disposed parallel to the first planar portion;
    a piezoelectric layer disposed between and contacting both the first planar portion and the second planar portion; and
    a support layer bonded to the second electrode, the support layer having a trap-rich layer that degrades a carrier lifetimes of a free charge carrier;
    an organic wall contacting the first side of the piezoelectric layer with a first wall via extending through the organic wall and contacting the first electrode and a second wall via extending through the organic wall and contacting the second electrode;
    an organic roof having first and second opposing sides with the first side bonded to the organic wall with a first roof via aligned with the first wall via and a second roof via aligned with the second wall via, wherein a combination of the organic wall, the organic roof and the first planar portion define a first acoustic gap;

a silicon handle contacting the second side of the piezoelectric layer; and a silicon wafer cap bonded to the silicon handle, wherein a combination of the silicon handle, the silicon wafer cap and the second planar portion define a second acoustic gap.

5. The acoustic resonator of claim 4 wherein the trap-rich layer is selected from the group consisting of amorphous silicon and polycrystalline silicon.

6. The acoustic resonator of claim 5 wherein the trap-rich layer has a thickness of from 500 nanometers (nm) and 800 nm.

7. The acoustic resonator of claim 6 wherein a silicon dioxide insulating layer is interposed between the trap-rich layer and both the first electrode and the second electrode.

* * * * *